(12) United States Patent
Hiroi et al.

(10) Patent No.: US 7,501,229 B2
(45) Date of Patent: Mar. 10, 2009

(54) ANTI-REFLECTIVE COATING CONTAINING SULFUR ATOM

(75) Inventors: Yoshiomi Hiroi, Toyama (JP); Takahiro Kishioka, Toyama (JP); Keisuke Nakayama, Toyama (JP); Rikimaru Sakamoto, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 43 days.

(21) Appl. No.: 10/592,805

(22) PCT Filed: Mar. 15, 2005

(86) PCT No.: PCT/JP2005/004554

§ 371 (c)(1), (2), (4) Date: Sep. 14, 2006

(87) PCT Pub. No.: WO2005/088398

PCT Pub. Date: Sep. 22, 2005

(65) Prior Publication Data

US 2008/0107997 A1    May 8, 2008

(30) Foreign Application Priority Data

Mar. 16, 2004    (JP) .............................. 2004-073905

(51) Int. Cl.
*G03F 7/11* (2006.01)
*C08L 101/00* (2006.01)
*H01L 21/027* (2006.01)

(52) U.S. Cl. ................. 430/325; 430/271.1; 430/272.1; 525/523; 525/417

(58) Field of Classification Search ....................... None
See application file for complete search history.

(56) References Cited

U.S. PATENT DOCUMENTS

| 5,693,691 A | 12/1997 | Flaim et al. |
| 5,919,599 A | 7/1999 | Meador et al. |
| 6,551,710 B1 | 4/2003 | Chen et al. |

| 2003/0215736 A1* | 11/2003 | Oberlander et al. ...... 430/270.1 |

FOREIGN PATENT DOCUMENTS

| JP | A-05-045873 | 2/1993 |
| JP | A 10-186671 | 7/1998 |
| JP | A 11-51194 | 9/1999 |
| JP | A 2000-187331 | 7/2000 |
| JP | A 2001-35779 | 2/2001 |
| JP | A 2001-502439 | 2/2001 |
| JP | A 2001-272788 | 10/2001 |
| JP | A 2002-198283 | 7/2002 |
| JP | A 2002-207103 | 7/2002 |
| JP | A 2002-236370 | 8/2002 |
| JP | A 2003-345027 | 12/2003 |
| JP | A 2004-101794 | 4/2004 |
| WO | WO 99/38924 A2 | 8/1999 |
| WO | WO 03/071357 A1 | 8/2003 |

OTHER PUBLICATIONS

Kim et al., "Adaptability and Validity of Thin Organic Bottom Anti-Reflective Coating (BARC) to Sub-90nm Patterning in ArF Lithography," Proceedings of SPIE, vol. 5039, pp. 940-947, (2003).

Schmaljohann et al., "Design Strategies for 157 nm Single-Layer Photoresists: Lithographic Evaluation of a Poly($\alpha$-Trifluoromethyl Vinyl Alcohol) Copolymer," Proceedings of SPIE, vol. 3999, pp. 330-334, (2000).

Crawford et al., "New Materials for 157 nm Photoresists: Characterization and Properties," Proceedings of SPIE, vol. 3999, pp. 357-364, (2000).

Patterson et al., "Polymers for 157 nm Photoresist Applications: A Progress Report," Proceedings of SPIE, vol. 3999, pp. 365-374, (2000).

* cited by examiner

*Primary Examiner*—Cynthia Hamilton
(74) *Attorney, Agent, or Firm*—Oliff & Berridge, PLC

(57) ABSTRACT

There is provided an anti-reflective coating forming composition comprising a solid content and a solvent, wherein a proportion of sulfur atom in the solid content is 5 to 25 mass %. The anti-reflective coating obtained from the composition has a high preventive effect for reflected light, causes no intermixing with photoresists, and can use in lithography process by use of a light having a short wavelength such as F2 excimer laser beam (wavelength 157 nm) or ArF excimer laser beam (wavelength 193 nm), etc.

4 Claims, No Drawings

ANTI-REFLECTIVE COATING CONTAINING SULFUR ATOM

TECHNICAL FIELD

The present invention relates to a composition for forming an anti-reflective coating. Specifically, the present invention relates to an anti-reflective coating for reducing reflection of irradiation light for exposing a photoresist layer applied on a semiconductor substrate from the substrate in lithography process for manufacturing a semiconductor device, and a composition for forming the anti-reflective coating. More specifically, the present invention relates to an anti-reflective coating that is used in lithography process for manufacturing a semiconductor device in which an irradiation light for exposure of wavelength 157 nm is utilized, and a composition for forming the anti-reflective coating. Further, the present invention relates to a method for forming photoresist pattern by use of the anti-reflective coating.

BACKGROUND ART

Conventionally, in the manufacture of semiconductor devices, micro-processing by lithography using a photoresist composition has been carried out. The micro-processing is a processing method comprising forming a thin film of a photoresist on a silicon wafer, irradiating actinic rays such as ultraviolet rays through a mask pattern on which a pattern for a semiconductor device is depicted, developing it to obtain a photoresist pattern, and etching the substrate using the photoresist pattern as a protective film. However, in recent progress in high integration of semiconductor devices, there has been a tendency that shorter wavelength actinic rays are being used, i.e., ArF excimer laser beam (wavelength 193 nm) has been taking the place of i-line (wavelength 365 nm) or KrF excimer laser beam (wavelength 248 nm). Along with this change, influences of random reflection and standing wave of actinic rays from a substrate have become serious problems. Accordingly, it has been widely studied to provide an anti-reflective coating between the photoresist and the substrate (bottom anti-reflective coating). In addition, micro-processing by lithography using F2 excimer laser beam (wavelength 157 nm) that is a light source having a shorter wavelength has been considered.

As the anti-reflective coatings, inorganic anti-reflective coatings made of titanium, titanium dioxide, titanium nitride, chromium oxide, carbon or α-silicon, etc. and organic anti-reflective coatings made of a light-absorbing substance and a high molecular weight compound are known. The former requires an installation such as a vacuum deposition apparatus, a CVD apparatus or a sputtering apparatus, etc. In contrast, the latter is considered advantageous in that it requires no special installation so that many studies have been made. For example, mention may be made of the acrylic resin type anti-reflective coating having a hydroxyl group being a crosslink-forming substituent and a light absorbing group in the same molecule as disclosed in U.S. Pat. No. 5,919,599 and the novolak resin type anti-reflective coating having a hydroxyl group being a crosslink-forming substituent and a light absorbing group in the same molecule as disclosed in U.S. Pat. No. 5,693,691, and so on.

The physical properties desired for organic anti-reflective coating include high absorbance to light and radioactive rays, no intermixing with the photoresist layer (being insoluble in photoresist solvents), no diffusion of low molecular substances from the anti-reflective coating material into the top-coat photoresist upon application or baking under heating, and a higher dry etching rate than the photoresist.

On the other hand, the past consideration of technique of anti-reflective coatings has been mainly carried out on lithography process by use of irradiation light having a wavelength of 365 nm, 248 nm or 193 nm. During such consideration, light-absorbing components and light-absorbing groups that efficiently absorb light of each wavelength have been developed, and they have come to be used as one component of the organic anti-reflective coating composition. For example, as to irradiation light of 365 nm, it is known that chalcone dyes resulting from the condensation of 4-hydroxyacetophenone with 4-methoxybenzaldehyde are effective (see, for example patent Document 1), as to irradiation light of 248 nm, it is known that naphthalene group-containing polymers having a specific structure show a high absorbance (see, for example patent Document 2), and as to irradiation light of 193 nm, it is known that resin binder compositions containing phenyl group unit are excellent (see, for example patent Document 3).

In recent years, a lithography process by use of F2 excimer laser beam (wavelength 157 nm) that is a light source having a shorter wavelength comes to be considered as next generation technique for processes by use of ArF excimer laser beam (wavelength 193 nm). The process is supposed to be able to carry out micro-processing of process dimension less than 100 nm, and at present, development and research have been actively done from the side of apparatus, material or the like. However, most of the research on the material relate to photoresists, it is the actual situation that the research on organic anti-reflective coatings is little known. This is because components effectively absorbing light of wavelength 157 nm, that is, light absorbing components having a strong absorption band at 157 nm have been little known.

It is estimated that in lithography process in which F2 excimer laser beam (wavelength 157 nm) is used as irradiation light, process dimension becomes 100 nm or less, therefore from the requirement of aspect ratio, photoresists are thought to be used in a thin film of film thickness of 100 to 300 nm that is thinner than that of the conventional ones. The organic anti-reflective coatings used together with the photoresists in a form of a thin film are required that they can be used in a form of thin film and they have a high selectivity for dry etching compared with photoresists. In addition, in order to use the organic anti-reflective coatings in a form of thin film of 30 to 80 nm, it is considered that the anti-reflective coatings are required to have a high attenuation coefficient (k). In the simulation with PROLITH ver. 5 (manufactured by Litho Tech Japan: as optical constants (refractive index, attenuation coefficient) of photoresist, expected ideal values are used), in case where silicon is used as a base substrate, as the anti-reflective coatings having a film thickness of 30 to 80 nm, coatings having a film thickness of secondary minimum film thickness (about 70 nm) can be used. In this case, the results revealed that the coatings having attenuation coefficient (k) of 0.3 to 0.6 would have a sufficient anti-reflective effect of reflection rate from substrate of 2% or less. As mentioned above, it is thought that a high attenuation coefficient (k), for example 0.3 or more is required in order to obtain a sufficient anti-reflective effect. However, little organic anti-reflective coatings satisfying such attenuation coefficient (k) have been known.

From such circumstances, also in lithography process by use of an irradiation light of wavelength 157 nm, it is desired to develop organic anti-reflective coatings that effectively absorb reflection light from substrates and are excellent in anti-reflective effect.

On the other hand, it is known that anti-reflective coating compositions comprising a fluorine-containing polymer are applied for lithography technique in which F2 excimer laser beam is used as a light source (see, for example patent Document 4). In addition, as anti-reflective coating forming compositions for lithography by use of F2 excimer laser beam, compositions containing halogen atom are known (see, for example patent Document 5).

In addition, in a lithography process by use of ArF excimer laser beam (wavelength 193 nm), in recent years, pattern collapse accompanied with miniaturization of photoresist pattern is becoming a problem. Against this problem, it is designed that aspect ratio is lowed by making a photoresist thinner to prevent pattern collapse. However, as the photoresist acts as a mask in an etching process of semiconductor substrate, it is feared that the photoresist in a form of thinner film causes damage to substrate processing by etching.

Therefore, a process in which a layer composed of an inorganic material called a hard mask is used as an etching stopper is considered in order to solve these problems. For hard masks, materials that absorb light having wavelength 193 nm, such as silicon oxide nitride (SiON) or silicon nitride (SiN) are often used. Thus, it is considered that the anti-reflective coatings used together with the above-mentioned hard mask are required to have a low attenuation coefficient (k) compared with the conventional anti-reflective coatings that are not used together with hard mask. For example, when silicon oxide nitride (SiON) or silicon nitride (SiN) is used as a hard mask and an anti-reflective coating having a film thickness of 20 to 50 nm is used thereon, it is expected that the attenuation coefficient (k) of the anti-reflective coating to a light of wavelength 193 nm is suitably about 0.1 to 0.3 (see, for example Non-patent Document 1). Consequently, it has been desired to develop a new anti-reflective coating.

Patent Document 1: JP-A-11-511194 (1999)
Patent Document 2: JP-A-10-186671 (1998)
Patent Document 3: JP-A-2000-187331 (2000)
Patent Document 4: JP-A-2002-236370 (2002)
Patent Document 5: WO 03/071357 pamphlet
Non-patent Document 1: Proceeding of SPIE, Vol. 5039, 2003, p. 940-947

DISCLOSURE OF INVENTION

Problem to be Solved by the Invention

An object of the present invention is to provide an anti-reflective coating having a strong absorption to a light having a short wavelength, particularly F2 excimer laser beam (wavelength 157 nm) or ArF excimer laser beam (wavelength 193 nm), and an anti-reflective coating forming composition for forming the anti-reflective coating. Another object of the present invention is to provide an anti-reflective coating that effectively absorbs light reflected from a semiconductor substrate in the use of F2 excimer laser beam (wavelength 157 nm) or ArF excimer laser beam (wavelength 193 nm) for fine processing in lithography process, that causes no intermixing with a photoresist layer and that has a high dry etching rate compared with the photoresist layer, and to provide an anti-reflective coating forming composition for forming the anti-reflective coating. Further, an object of the present invention is also to provide a method for forming a photoresist pattern by use of the anti-reflective coating forming composition.

Means for Solving the Problem

Taking the above-mentioned present status into account, the present inventors eagerly investigated, and as a result of it, they found that an anti-reflective coating excellent for a light having a short wavelength can be formed from an anti-reflective coating forming composition in which the proportion of sulfur atom in a solid content is 5 to 25 mass %, and they completed the present invention.

That is, the present invention relates to the following aspects:

as a first aspect, an anti-reflective coating forming composition comprising a solid content and a solvent, wherein a proportion of sulfur atom in the solid content is 5 to 25 mass %;

as a second aspect, the anti-reflective coating forming composition comprising as described in the first aspect, wherein the solid content contains a polymer having sulfur atom in an amount of 8 to 30 mass %, a crosslinking compound and an acid compound;

as a third aspect, the anti-reflective coating forming composition as described in the second aspect, wherein the polymer is a polymer produced from at least one compound selected from the group consisting of acrylic acid ester compounds having sulfur atom, methacrylic acid ester compounds having sulfur atom, and styrene compounds having sulfur atom;

as a fourth aspect, the anti-reflective coating forming composition as described in the second aspect, wherein the polymer is a polymer produced from a compound having at least two thiol groups;

as a fifth aspect, the anti-reflective coating forming composition as described in the second aspect, wherein the polymer is a polymer produced from a compound having two thiol groups and a compound having two epoxy groups;

as a sixth aspect, the anti-reflective coating forming composition as described in the second aspect, wherein the polymer is a polymer having a thiophene ring structure;

as a seventh aspect, an anti-reflective coating obtained by coating the anti-reflective coating forming composition as described in any one of the first to sixth aspects on a substrate, and baking it, wherein the anti-reflective coating has an attenuation coefficient to F2 excimer laser beam (wavelength 157 nm) of 0.2 to 0.50;

as an eighth aspect, a method for forming photoresist pattern for use in manufacture of semiconductor device, comprising the steps of:

coating the anti-reflective coating forming composition as described in any one of the first to sixth aspects on a semiconductor substrate, and baking it to form an anti-reflective coating, forming a photoresist layer on the anti-reflective coating, exposing the semiconductor substrate covered with the anti-reflective coating and the photoresist layer to light, and developing the photoresist layer after the exposure to light; and as a ninth aspect, the method for forming photoresist pattern as described in the eighth aspect, wherein the exposure to light is carried out with F2 excimer laser beam (wavelength 157 nm).

Effect of the Invention

The present invention relates to a composition for forming an anti-reflective coating having an absorption to a light having a short wavelength, particularly F2 excimer laser beam (wavelength 157 nm) or ArF excimer laser beam (wavelength 193 nm), and an anti-reflective coating obtained from the composition.

The anti-reflective coating effectively absorbs a light reflected from a semiconductor substrate in fine processing by use of a light having a short wavelength, particularly F2 excimer laser beam (wavelength 157 nm) or ArF excimer laser beam (wavelength 193 nm), causes no intermixing with a photoresist layer and has a high dry etching rate compared with the photoresist layer.

In addition, the use of the anti-reflective coating of the present invention makes possible to form a photoresist pattern having a good form in lithography process by use of a light having a short wavelength.

Further, the present invention can provide a method for controlling attenuation coefficient (k) of the anti-reflective coating. The control of attenuation coefficient (k) is achieved by altering the content of sulfur atom in the solid content in the anti-reflective coating forming composition. The controlling method makes possible to alter characteristics such as attenuation coefficient (k) of the anti-reflective coating depending on the kind of photoresists and demand characteristics, and the like.

BEST MODE FOR CARRYING OUT THE INVENTION

The anti-reflective coating forming composition of the present invention comprises a solid content and a solvent. The proportion of the solid content in the anti-reflective coating forming composition is 0.1 mass % or more, preferably for example 0.1 to 7.0 mass %, or for example 0.5 to 50 mass %, or 1 to 30 mass %.

The anti-reflective coating is formed by coating the anti-reflective coating forming composition of the present invention on a semiconductor substrate or the like, and baking it. It is considered that the solid content constitutes the anti-reflective coating because the almost entire solvent component of the anti-reflective coating forming composition is vaporized in the baking. The solid content of the anti-reflective coating forming composition is required to contain sulfur atom in an amount of at least 5 mass % so that the anti-reflective coating of the present invention may show a large absorption to a light having a short wavelength, particularly F2 excimer laser beam (wavelength 157 nm). The proportion of sulfur atom in the solid content of the anti-reflective coating forming composition according to the present invention is 5 mass % or more, preferably for example 5 to 40 mass %, or for example 7 to 35 mass %, or 10 to 30 mass %, or 15 to 25 mass %. The practical range of the proportion of sulfur atom in the solid content is 5 to 25 mass %. It is assumed that the proportion of sulfur atom in the solid content correspond to the proportion of sulfur atom in the anti-reflective coating.

In the solid content of the anti-reflective coating forming composition according to the present invention, a sulfur atom-containing compound is an essential component. The sulfur atom-containing compound is not specifically limited, and may be for example a polymer, or a low molecular weight compound having a molecular weight of about 200 to 2000. Also, it may be a combination of a sulfur atom-containing polymer with a sulfur atom-containing low molecular weight compound. And, the solid content can contain other components such as a compound containing no sulfur atom (polymer, low molecular weight compound), a crosslinking compound, an acid compound, a rheology controlling agent, and a surfactant, etc. When the arbitrary components are contained, the content proportion is not specifically limited. So long as the proportion of sulfur atom in the solid content is 5 mass % or more, sulfur atom-containing compounds can be suitably combined with the above-mentioned other components. It is preferable that the proportion of sulfur atom-containing compound in the solid content is 50 mass %, for example 50 to 100 mass %, or 60 to 95 mass %, or 65 to 90 mass %, or 70 to 90 mass %, or 75 to 85 mass %. From the viewpoint of ease of the formation of anti-reflective coating, it is preferable that the sulfur atom-containing compound is used in a combination with a crosslinking compound. Also, from the viewpoint of ease of the formation of anti-reflective coating, it is preferable that the sulfur atom-containing compound is used in a combination with a crosslinking compound and an acid compound.

The sulfur atom-containing low molecular weight compound contained in the anti-reflective coating forming composition of the present invention is not specifically limited so long as it is a sulfur atom-containing compound. The low molecular weight compound includes for example ethane dithiol, 1,3-propane dithiol, 1,4-butane dithiol, 1,2-butane dithiol, 2,3-butane dithiol, 1,5-pentane dithiol, 1,6-hexane dithiol, 1,8-octane dithiol, 1,9-nonane dithiol, 1,10-decane dithiol, 3,6-dioxaoctane-1,8-dithiol, 2,2'-oxydiethanethiol, 2,3-dimercapto-1-propanol, dithioerythritol, dithiothreitol, 1,4-benzene dithiol, 1,3-benzene dithiol, 1,2-benzene dithiol, 4-chloro-1,3-benzene dithiol, 4-methyl-1,2-benzene dithiol, 4,5-dimethyl-1,2-benzenedimethane thiol, 2,3-quinoxylene dithiol, 2,5-dicarboxythiphene, 2-mercaptoethylsulfide, 2,5-dihydroxy-1,4-dithian, 2-methylthio barbturic acid, 2-thio barbturic acid, 5-mercaptomethyl uracil, 2-dimethylamino-1, 3,5-triazine-4,6-dithiol, 2-methoxy-1,3,5-triazine-4,6-dithiol, 2-dibutylamino-1,3,5-triazine-4,6-dithiol, 2-N-phenylamino-1,3,5-triazine-4,6-dithiol, dicyclohexylamino-1,3, 5-triazine-4,6-dithiol, thiocyanuric acid, bismuthiol, 2-(methylthio)ethylmethacrylate, 5-(methacryloyloxy)methyl-1,3-oxathiolane-2-thione, tris( 1,3-oxathilane-2-thion-5-yl-methyl)isocyanuric acid, bis[4-(2,3-epoxypropylthio) phenyl]sulfide, and bis(2,3-epoxypropyl)sulfide, and the like.

When the sulfur atom-containing low molecular weight compound is used, from the viewpoint of ease of the formation of anti-reflective coating, it is preferable to use the low molecular weight compound in a combination with a polymer or a crosslinking compound. In case where the low molecular weight compound is used in a combination with a crosslinking compound, the sulfur atom-containing low molecular weight compound is preferably a compound having a crosslinking substituent such as carboxy group, hydroxy group, and thiol group, or the like in its molecule.

As the sulfur atom-containing compound contained in the anti-reflective coating forming composition of the present invention, a sulfur atom-containing polymer can be used. The molecular weight of the polymer is in the term of weight average molecular weight, 1000 or more, preferably for example 1000 to 300000, or for example 1000 to 100000, for example 1000 to 30000, or 2000 to 10000.

As the sulfur atom-containing polymer, polymers having sulfur atom in the molecule can be used without specific limitation. When sulfur atom is contained in the polymer in an amount less than 5 mass %, it is used in a combination with a sulfur atom-containing low molecular weigh compound in order to satisfy the proportion (5 mass % or more) of sulfur atom in the solid content. From the viewpoint of satisfying the proportion of sulfur atom in the solid content, the sulfur atom-containing polymer used is preferably a polymer having sulfur atom in an amount of 5 mass % or more. The used polymer is preferably a polymer having sulfur atom in an amount of 5 to 40 mass %, or 8 to 35 mass %, or 10 to 30 mass %. Practically, the sulfur atom-containing polymer contains sulfur atom in amount of 8 to 30 mass %. The sulfur atom-containing polymer can be produced by known several methods such as addition polymerization, ring-opening polymerization, and condensation polymerization, or the like.

As the sulfur atom-containing polymer, a polymer produced from at least one compound selected from the group consisting of acrylic acid ester compounds having sulfur atom, methacrylic acid ester compounds having sulfur atom, and styrene compounds having sulfur atom can be used. Such a polymer can be produced by using one compound among the above-mentioned compounds or a combination of two or more compounds, for example through radical polymerization by use of a polymerization initiator such as azobisisobutyronitrile, and azobiscyclohexane carbonitrile or the like. The polymerization is carried out in a suitable solvent by suitably selecting a reaction temperature of 30 to 150° C. and a reaction time of 0.5 to 24 hours.

The sulfur atom-containing acrylic acid ester compounds include for example 2-(methylthio)ethylacrylate, and 5-(acryloyloxy)methyl-1,3-oxathiolane-2-thione, or the like.

The sulfur atom containing-methacrylic acid ester compounds include for example 2-(methylthio)ethylmethacrylate, and 5-(methacryloyloxy)methyl-1,3-oxathiolane-2-thione, or the like.

The sulfur atom-containing styrene compounds include for example 4-vinylphenylisothiocyanate, 4-styrenesulfonylchloride, and 4-styrene sulfonic acid, or the like.

In addition, in the production of the sulfur atom-containing polymer, addition polymerizable compounds containing no sulfur atom can be used together other than the above-mentioned compounds. The addition polymerizable compounds include for example acrylic acid ester compounds, methacrylic acid ester compounds, acrylamide compounds, methacrylamide compounds, vinyl compounds, styrene compounds, maleimide compounds, maleic anhydride, and acrylonitrile, and the like.

The acrylic acid ester compounds include for example methyl acrylate, ethyl acrylate, isopropyl acrylate, benzyl acrylate, naphthyl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, tert-butyl acrylate, cyclohexyl acrylate, 2-methoxyethyl acrylate, 2-ethoxyethyl acrylate, tetrahydrofurfuryl acrylate, 3-methoxybutyl acrylate, 2-methyl-2-adamantyl acrylate, 8-methyl-8-tricyclodecyl acrylate, and 8-ethyl-8-tricyclodecyl acrylate, and the like.

The methacrylic acid ester compounds include methacrylic acid ester compounds corresponding to the above-mentioned acrylic acid ester compounds.

The acrylamide compounds include acrylamide, N-methylacrylamide, N-ethylacrylamide, N-benzylacrylamide, N-phenylacrylamide, and N,N-dimethylacrylamide, and the like.

The methacrylamide compounds include methacrylamide compounds corresponding to the above-mentioned acrylamide compounds.

The vinyl compounds include vinyl alcohol, vinyl acetic acid, vinyl acetate, methyl vinyl ether, benzyl vinyl ether, 2-hydroxyethyl vinyl ether, phenyl vinyl ether, and propyl vinyl ether, and the like.

The styrene compounds include styrene, methylstyrene, chlorostyrene, bromostyrene, and hydroxystyrene, and the like.

The maleimide compounds include maleimide, N-methyl maleimide, N-phenyl maleimide, and N-cyclohexyl maleimide, and the like.

The sulfur atom-containing polymer used in the anti-reflective coating forming composition of the present invention includes for example polymers of formulae (1) to (4) wherein p1 and p2 are proportion (%) of each unit structure in the polymer, and the sum thereof is 100%.

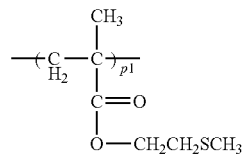

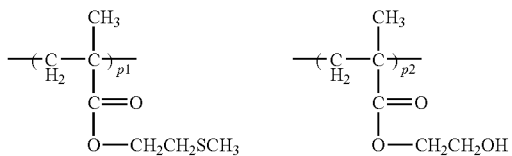

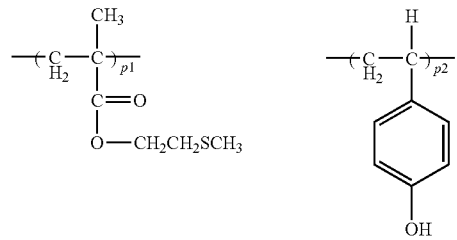

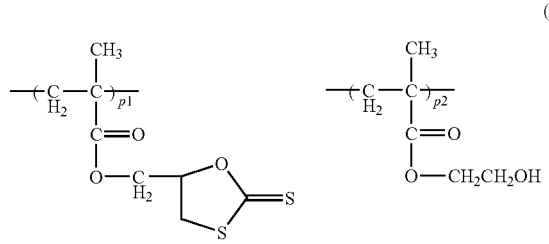

As the sulfur atom-containing polymer used in the anti-reflective coating forming composition of the present invention, a polymer produced from a compound having at least two thiol groups can be also used. The polymer can be produced by reacting a compound having in its molecule at least two groups that are able to react with a thiol group such as epoxy group, carboxyl group, isocyanate group, isothiocyanate group, olefin, methacrylate, acrylate, and cation moiety activated with a counter anion species, or the like with a compound having at least two thiol groups. The reaction is carried out in a suitable solvent by suitably selecting a reaction temperature of 30 to 150° C. and a reaction time of 0.5 to 24 hours. In addition, for the reaction, a compound such as an acid, a base, a quaternary ammonium salt, azobisisobutyronitrile, azobiscyclohexane carbonitrile, and an anion species activating a cation species, or the like can be used, if necessary.

The compound having at least two thiol groups includes for example compounds having 2 to 4 thiol groups. Concrete examples are ethane dithiol, 1,3-propane dithiol, 1,4-butane dithiol, 1,2-butane dithiol, 2,3-butane dithiol, 1,5-pentane dithiol, 1,6-hexane dithiol, 1,8-octane dithiol, 1,9-nonane dithiol, 1,10-decane dithiol, 3,6-dioxaoctane-1,8-dithiol, 2,2' oxydiethanethiol, 2-mercaptoethyl sulfide, 2,3-dimercapto-1-propanol, dithioerythritol, dithiothreitol, 1,4-benzene dithiol, 1,3-benzene dithiol, 1,2-benzene dithiol, 4-chloro-1,3-benzene dithiol, 4-methyl-1,2-benzene dithiol, 4,5-dimethyl-1,2-benzenedimethane thiol, 2,3-quinoxylene dithiol, 2-dimethylamino-1,3,5-triazine-4,6-dithiol, 2-methoxy-1,3,5-triazine-4,6-dithiol, 2-dibutylamino-1,3,5-triazine-4,6-dithiol, 2-N-phenylamino-1,3,5-triazine-4,6-dithiol, dicyclohexylamino-1,3,5-triazine-4,6-dithiol, thiocyanuric acid, and bismuthiol. These compounds may be used alone or in a combination of two or more.

The above-mentioned compound having at least two groups that are able to react with the thiol groups includes for example compounds having such groups of 2 to 4. Concrete examples are bis[4-(2,3-epoxypropylthio)phenyl]sulfide, bis(2,3-epoxypropyl)sulfide, bis(2,3-epoxypropyl)ether, ethylene glycol diglycidyl ether, monoallyl diglycidyl isocyanuric acid, bis(2,3-epoxypropyl)isocyanuric acid, 2,2-bis(4-2,3-epoxypropyloxy)phenyl)propane, 1,2-bis(2,3-epoxypropoxy)benzene, 1,3-bis(2,3-epoxypropoxy)benzene, 1,4-bis(2,3-epoxypropoxy)benzene, 1,2-bis(2,3-epoxypropoxyester)benzene dicarboxylic acid, 1,3-bis(2,3-epoxypropoxyester)benzene dicarboxylic acid, 1,4-bis(2,3-epoxypropoxyester)benzene dicarboxylic acid, 1,6-hexanedioldiacrylate, pentaerythritol triacrylate, diethylene glycol acrylate, glycerin-1,3-dimethacrylate, oxychloride, phthaloyl dichloride, terephthaloyl dichloride, fumaric chloride, 1,4-benzenedithioisocynate, and 1,4-benzeneisocyante, and the like. These compounds may be used alone or in a combination of two or more.

The polymer produced from a compound having at least two thiol groups that is used in the anti-reflective coating forming composition of the present invention includes for example the polymers having repeating structural unit of formulae (5) to (13).

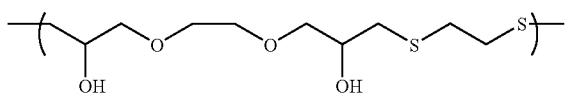
(5)

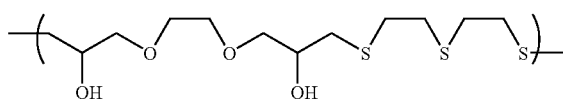
(6)

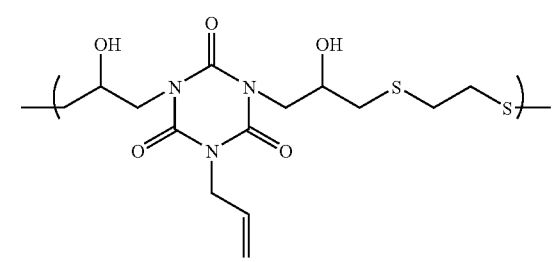
(7)

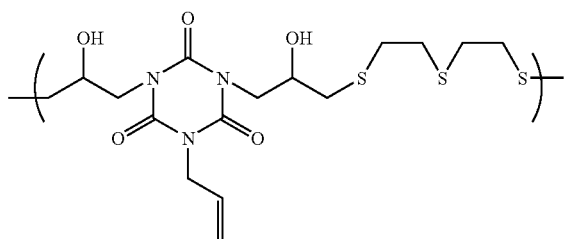
(8)

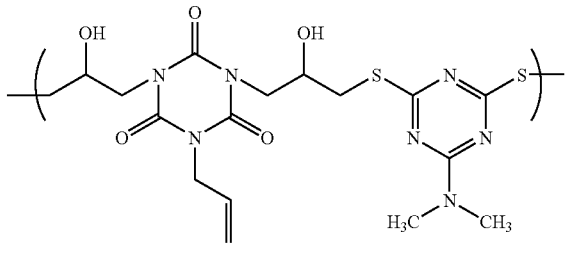
(9)

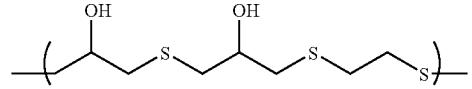
(10)

-continued

(11)

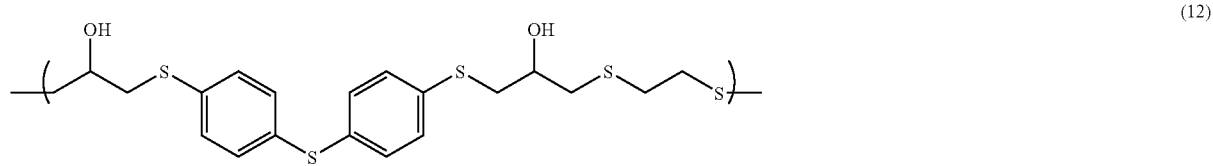
(12)

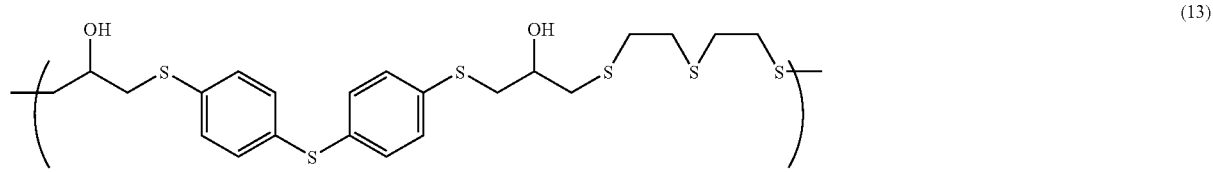
(13)

The polymer having the repeating structural unit of formula (7) can be produced for example by reacting monoallyldiglycidyl isocyanuric acid with ethane dithiol in the presence of benzyltriethyl ammonium chloride in propylene glycol monomethyl ether.

As the sulfur atom-containing polymer used in the anti-reflective coating forming composition of the present invention, a polymer having a thiophene ring structure can be also used. The polymers include for example polymers having the repeating structural units of formulae (14) to (15).

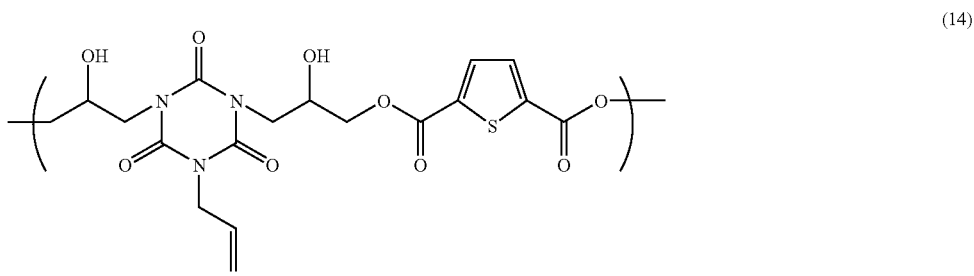
(14)

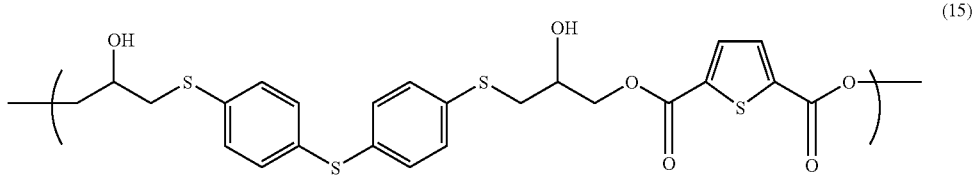
(15)

The polymer produced from a compound having at least two thiol groups that is used in the anti-reflective coating forming composition of the present invention includes a polymer produced by polyaddition from a compound having two thiol groups and a compound having two epoxy groups from the viewpoint of ease of the synthesis or the like.

The compound having two epoxy groups includes for example bis[4-(2,3-epoxypropylthio)phenyl]sulfide, bis(2,3-epoxypropyl)sulfide, bis(2,3-epoxypropyl)ether, ethylene glycol diglycidyl ether, monoallyl diglycidyl isocyanuric acid, 2,2-bis[4-(2,3-epoxypropyloxy)phenyl]propane, 1,2-bis(2,3-epoxypropoxy)benzene, 1,3-bis(2,3-epoxypropoxy)benzene, 1,4-bis(2,3-epoxypropoxy)benzene, 1,2-bis(2,3-epoxypropoxyester)benzene dicarboxylic acid, 1,3-bis(2,3-epoxypropoxyester)benzene dicarboxylic acid, and 1,4-bis(2,3-epoxypropoxyester)benzene dicarboxylic acid, and the like.

In addition, the polymers having a thiophene ring structure include for example polymers produced by polyaddition from a thiophene compound having two carboxyl groups such as 2,5-dicarboxy thiophene and 3,4-dicarboxy thiophene, or the like, and a compound having two epoxy groups.

The polymers having the repeating structural unit of formula (15) can be produced for example by reacting bis[4-(2,3-epoxypropylthio)phenyl]sulfide with 2,5-dicarboxy thiophene in the presence of benzyltriethyl ammonium chloride in propylene glycol monomethyl ether.

The solid content in the anti-reflective coating forming composition of the present invention can contain in addition to the above-mentioned components, a compound containing no sulfur atom (polymer, low molecular weight compound), a crosslinking compound, an acid compound, a rheology controlling agent, and a surfactant, etc.

From the viewpoint of ease of anti-reflective coating formation and light-absorbing property of the anti-reflective coating, it is preferable that the anti-reflective coating forming composition comprises a solid content composed of a polymer having sulfur atom in an amount of 8 to 30 mass %, a crosslinking compound and an acid compound, wherein the proportion of sulfur atom in the solid content is 5 to 25 mass %.

The polymer containing no sulfur atom is for example a polymer produced from addition polymerizable compounds containing no sulfur atom, and includes the above-mentioned addition polymerizable compounds containing no sulfur atom, such as acrylic acid ester compounds, methacrylic acid ester compounds, acrylamide compounds, methacrylamide compounds, vinyl compounds, styrene compounds, maleimide compounds, maleic anhydride, and acrylonitrile, and the like. In addition, other compounds include for example polyester, polyamide, polyimide, polyamic acid, polycarbonate, polyether, phenol novolak, cresol novolak, and naphthol novolak, and the like. The low molecular weight compounds containing no sulfur atom include for example 2,3,5-tris(2-hydroxy)isocyanuric acid, 2-chloroethanol, p-xylene glycol, glycerin, 1,3-benzene dimethanol, trimesic acid, sic acid, mellitic acid, and pyromellitic acid, etc. When the compound containing no sulfur atom is used, the used amount thereof is for example 0.1 to 40 mass % in the solid content.

The crosslinking compounds are not specifically limited, and crosslinking compounds having at least two crosslink-forming substituents are preferably used. They include for example melamine type compounds or substituted urea type compounds having crosslink-forming substituents for example methylol or alkoxymethyl such as methoxymethyl, ethoxymethyl, butoxymethyl, and hexyloxymethyl, or the like. Concrete examples are methoxymethylated glycol uril, or methoxymethylated melamine, and the like. Concretely, they are for example nitrogen-containing compounds such as hexamethoxymethyl melamine, tetramethoxymethyl benzoguanamine, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, 1,1,3,3-tetrakis(methoxymethyl)urea, 1,3-bis(hydroxymethyl)-4,5-dihydroxy-2-imidazolinone, and 1,3-bis(methoxymethyl)-4,5-dimethoxy-2-imidazolinone, etc. These crosslinking compounds can take place crosslinking reaction due to self-condensation. In addition, in case where the polymer or low molecular weight compound contained in the solid content has a crosslinking substituent such as carboxy group, hydroxy group, and thiol group, etc., the crosslinking compound can take place a crosslinking reaction with these substituents.

When the crosslinking compound is used, the used amount thereof is for example 0.1 to 40 mass %, for example 1 to 35 mass %, or for example 3 to 30 mass %, or 5 to 25 mass % in the solid.

The acid compound includes for example p-toluene sulfonic acid, trifluoromethane sulfonic acid, pyridinium-p-toluenesulfonate, salicylic acid, sulfosalicylic acid, citric acid, benzoic acid, and hydroxy benzoic acid, etc.

As the acid compounds, aromatic sulfonic acid compounds can be used. Concrete examples of the aromatic sulfonic acid compounds are p-toluene sulfonic acid, pyridinium-p-toluenesulfonate, sulfosalicylic acid, 4-chlorobenzenesulfonic acid, 4-hydroxybenzenesulfonic acid, benzenedisulfonic acid, 1-naphthalenesulfonic acid, and pyridinium-1-naphthalenesulfonic acid, etc.

In addition, the acid compounds include acid generators that generate an acid with heat or light, such as 2,4,4,6-tetrabromocyclohexadienone, benzointosylate, 2-nitrobenzyltosylate, bis(4-tert-butylphenyl)iodonium trifluoromethanesulfonate, triphenylsulfonium trifluoromethanesulfonate, phenyl-bis(trichloromethyl)-s-triazine, and N-hydroxysuccinimide trifluoromethanesulfonate, etc. As the acid compound, an acid and an acid generator can be used in a combination. When the acid compound is used, the used amount thereof is for example 0.001 to 10 mass %, or for example 0.001 to 3 mass %, or 0.1 to 2 mass % in the solid content. The use of the acid compound accelerates the reaction of the crosslinking compound.

The rheology controlling agents include for example phthalic acid derivatives such as dimethyl phthalate, diethyl phthalate, diisobutyl phthalate, dihexyl phthalate, butyl isodecyl phthalate, or the like, adipic acid derivatives such as di-n-butyl adipate, diisobutyl adipate, diisooctyl adipate, octyldecyl adipate, or the like, maleic acid derivatives such as di-n-butyl maleate, diethyl maleate, dinonyl maleate, or the like, oleic acid derivatives such as methyl oleate, butyl oleate, tetrahydrofurfuryl oleate, or the like, stearic acid derivatives such as n-butyl stearate, glyceryl stearate, or the like. When the rheology controlling agent is used, the used amount thereof is for example 0.001 to 10 mass % in the solid content.

The surfactants include for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc., polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate,. polyoxyethylene sorbitan monostearate, polyoxyethylene sorbitan trioleate, polyoxyethylene sorbitan tristearate, etc.; fluorine based surfactants, e.g., trade name: EFTOP EF301, EF303, EF352 (manufactured by Tochem Products Co., Ltd.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The surfactants may be added singly or in combination of two or more. When the surfactant is used, the used amount thereof is for example 0.0001 to 5 mass % in the solid content.

The solid content can contain other components such as adhesion auxiliaries, light absorbing agents, and the like.

The solvent used in the anti-reflective coating forming composition of the present invention is not specifically limited so long as it can dissolve the solid content. Such organic solvents include for example ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate, etc. These solvents is used singly or in combination of two or more. Further, high boiling solvents such as propylene glycol monobutyl ether or propylene glycol monobutyl ether acetate, etc. may be mixed and used.

Hereinafter, the utilization of the anti-reflective coating forming composition of the present invention is described.

The anti-reflective coating forming composition of the present invention is applied on a semiconductor substrate (for example, silicon/silicon dioxide coat substrate, silicon wafer, silicon nitride substrate, glass substrate, and ITO substrate, etc.) by a suitable coating method, for example, with a spinner, a coater or the like, and thereafter the substrate is baked to fabricate an anti-reflective coating. The conditions of baking are suitably selected from baking temperature of 80 to 250° C. and baking time of 0.3 to 60 minutes. Preferably the baking temperature is 130 to 250° C. and the baking time is 0.5 to 5 minutes. The thickness of the anti-reflective coating is for example 10 to 3000 nm, or for example 30 to 1000 nm, or 50 to 200 nm.

The anti-reflective coating of the present invention shows a large absorption to a light having a short wavelength, particularly F2 excimer laser beam (wavelength 157 nm) as it contains a large amount of sulfur atom. The anti-reflective coating forming composition of the present invention makes possible to form an anti-reflective coating having an attenuation coefficient (k) to F2 excimer laser beam (wavelength 157 nm) of 0.20 to 0.50, 0.25 to 0.50 or 0.25 to 0.40.

In addition, the anti-reflective coating forming composition of the present invention makes possible to control the attenuation coefficient (k) of the formed anti-reflective coating by altering the proportion of sulfur atom contained in the solid content. The proportion of sulfur atom in the solid content can be controlled by altering the kind or amount of the compound containing sulfur atom to be used. The suitable selection of the proportion of sulfur atom in the solid content makes possible to control the attenuation coefficient (k) of the anti-reflective coating.

Then, a photoresist layer is formed on the anti-reflective coating. The formation of the photoresist layer can be conducted by well-known process, that is, by application of a photoresist composition solution on the anti-reflective coating and baking.

The photoresist to be coated and formed on the anti-reflective coating of the present invention is not specifically limited so long as it is sensitive to an exposure light, and any of negative type and positive type photoresists can be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular weight compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular weight compound which is decomposed with an acid and increases the alkali dissolution rate of the photoresist. Also, it includes fluorine atom-containing polymer type photoresist as mentioned in for example, Proc. SPIE, Vol. 3999, 330-334 (2000), Proc. SPIE, Vol. 3999, 357-364 (2000), or Proc. SPIE, Vol. 3999, 365-374 (2000).

Subsequently, exposure to light is carried out through a predetermined mask. For the exposure to light, KrF excimer laser beam (wavelength 248 nm), ArF excimer laser beam (wavelength 193 nm) and F2 excimer laser beam (wavelength 157 nm), etc. can be used. After the exposure, post exposure bake may be performed, if necessary. The post exposure bake is conducted by suitably selecting from a heating temperature of 70 to 150° C. and a heating time of 0.3 to 10 minutes.

Next, development is conducted by use of a developer. For example in case where a positive type photoresist is used, the development results in removal of exposed part of the photoresist and forming of photoresist pattern. The developer includes for example alkaline aqueous solution e.g., an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, choline or the like, amine aqueous solution such as ethanolamine, propylamine, ethylenediamine or the like. Further, surfactants can be added in these developers. The condition of development is suitably selected from a temperature of 5 to 50° C. and a time of 10 to 300 seconds.

Then, removal of the anti-reflective coating and processing of the semiconductor substrate are conducted by using the photoresist pattern formed as mentioned above as a protective coating. The removal of the anti-reflective coating is conducted by use of a gas such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, etc.

Before or after forming the anti-reflective coating of the present invention on a semiconductor substrate, a flattening coating or a gap-fill material layer may be formed. In case where semiconductor substrates having large steps or holes of a high aspect ratio are used, it is preferable that the flattening coating or the gap-fill material layer is formed.

Also, before or after forming the anti-reflective coating of the present invention on a semiconductor substrate, a hard mask composed of silicon oxide nitride (SiON) and silicon nitride (SiN) or the like may be formed. And, the anti-reflective coating forming composition of the present invention can be used on the hard mask.

The semiconductor substrates on which the anti-reflective coating forming composition of the present invention is applied may be substrates on which an inorganic anti-reflective coating is formed by CVD method or the like, and the anti-reflective coating of the present invention can be formed thereon.

Further, the anti-reflective coating of the present invention can be used as a layer for preventing an interaction between the substrate and the photoresist, as a layer having a function that prevents an adverse effect against the substrate by the material used for the photoresist or by substances formed on exposure to light of the photoresist, as a layer having a function that prevents diffusion of substances formed in the substrate on baking under heating to the upper layer photoresist, and as a barrier layer for reducing any poisoning effect of the photoresist layer by the semiconductor substrate dielectric layer.

In addition, the anti-reflective coating formed from the anti-reflective coating forming composition can be used as a filling agent that can fill via holes without gap by applying it for the substrate on which via holes are formed and which is used in dual damascene process. Further, it can be used as a flattening agent for flattening the surface of semiconductor substrate having unevenness.

Hereinafter, the present invention will be described based on examples further concretely but the present invention is not limited thereto.

EXAMPLES

Synthetic Example 1

In 28.42 g of propylene glycol monomethyl ether, 5.00 g of ethylene glycol diglycidyl ether, 1.88 g of ethane dithiol and 0.23 g of benzyl triethyl ammonium chloride were added, and reacted under reflux for 24 hours to obtain a solution containing a polymer having the repeating structural unit of formula (5). GPC analysis showed that weight average molecular weight of the obtained polymer was 3300 (in terms of standard polystyrene).

Synthetic Example 2

In 34.63 g of propylene glycol monomethyl ether, 5.00 g of ethylene glycol diglycidyl ether, 3.43 g of 2,5-dicarboxy thiophene and 0.23 g of benzyl triethyl ammonium chloride were added, and reacted under reflux for 24 hours to obtain a solution containing a polymer having the repeating structural unit of formula (16). GPC analysis showed that weight average molecular weight of the obtained polymer was 3600 (in terms of standard polystyrene).

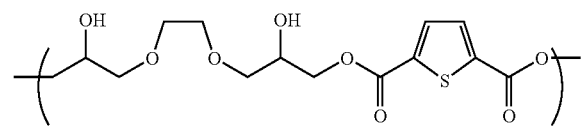

(16)

Synthetic Example 3

In 31.93 g of propylene glycol monomethyl ether, 5.00 g of ethylene glycol diglycidyl ether, 2.76 g of 2,2'-oxydiethane thiol and 0.23 g of benzyl triethyl ammonium chloride were added, and reacted under reflux for 24 hours to obtain a solution containing a polymer having the repeating structural unit of formula (17). GPC analysis showed that weight average molecular weight of the obtained polymer was 3500 (in terms of standard polystyrene).

(17)

Synthetic Example 4

In 33.21 g of propylene glycol monomethyl ether, 5.00 g of ethylene glycol diglycidyl ether, 3.08 g of 2-mercaptoethyl sulfide and 0.23 g of benzyl triethyl ammonium chloride were added, and reacted under reflux for 24 hours to obtain a solution containing a polymer having the repeating structural unit of formula (6). GPC analysis showed that weight average molecular weight of the obtained polymer was 3800 (in terms of standard polystyrene).

Synthetic Example 5

In 19.93 g of propylene glycol monomethyl ether, 3.00 g of ethylene glycol diglycidyl ether, 1.84 g of dithioerythriol and 0.14 g of benzyl triethyl ammonium chloride were added, and reacted under reflux for 24 hours to obtain a solution containing a polymer having the repeating structural unit of formula (18). GPC analysis showed that weight average molecular weight of the obtained polymer was 3200 (in terms of standard polystyrene).

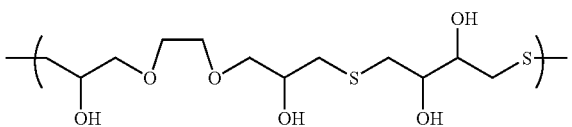

(18)

Synthetic Example 6

In 61.52 g of propylene glycol monomethyl ether, 4.98 g of ethylene dithiol, 10 g of monoallyl diglycidyl isocyanuric acid and 0.40 g of benzyl triethyl ammonium chloride were added, and reacted under reflux for 24 hours to obtain a solution containing a polymer having the repeating structural unit of formula (7). GPC analysis showed that weight average molecular weight of the obtained polymer was 16800 (in terms of standard polystyrene).

Synthetic Example 7

60 g of 2-hydroxypropyl methacrylate was dissolved in 242 g of propylene glycol monomethyl ether, and the temperature was raised to 70° C. Thereafter, while the reaction solution was kept at 70° C., 0.6 g of azobisisobutyronitrile was added and reacted at 70° C. for 24 hours to obtain a solution containing poly (2-hydroxypropylmethacrylate). GPC analysis showed that weight average molecular weight of the obtained polymer was 50000 (in terms of standard polystyrene).

Example 1

In 3.92 g (polymer concentration 20 mass %) of the solution containing polymer obtained in Synthetic Example 1, 0.20 g of tetramethoxymethylglycoluril (manufactured by Mitsui Cytec Co., Ltd., trade name: Powderlink 1174), 0.02 g of pyridinium-p-toluene sulfonate, 6.36 g of propylene glycol monomethyl ether, and 9.5 g of ethyl lactate were added, and then filtered through a micro filter made of polyethylene having a pore diameter of 0.05 μm to prepare an anti-reflective coating forming composition solution.

Examples 2 to 6

The procedures similar to those of Example 1 were carried out by using the solutions containing polymer obtained in Synthetic Examples 2 to 6 to prepare anti-reflective coating forming compositions, respectively.

Comparative Example 1

In 3.92 g (polymer concentration 20 mass %) of the solution containing polymer obtained in Synthetic Example 7, 0.20 g of tetramethoxymethylglycoluril (manufactured by Mitsui Cytec Co., Ltd., trade name: Powderlink 1174), 0.02 g of pyridinium-p-toluene sulfonate, 6.36 g of propylene glycol monomethyl ether, and 9.5 g of ethyl lactate were added, and then filtered through a micro filter made of polyethylene having a pore diameter of 0.05 μm to prepare an anti-reflective coating forming composition solution.

Dissolution Test in Photoresist Solvent

The anti-reflective coating forming composition solutions obtained in Examples 1 to 6 and Comparative Example 1 were coated on semiconductor substrates (silicon wafers) by means of a spinner, respectively. The coated silicon wafers were baked at 205° C. for 1 minute on a hot plate to form anti-reflective coatings (film thickness 100 nm). The anti-reflective coatings were dipped in ethyl lactate and propylene glycol monomethyl ether that are solvents used for photoresists, and as a result it was confirmed that the resulting anti-reflective coatings were insoluble in these solvents.

Test of Intermixing with Photoresist

The anti-reflective coating forming composition solutions obtained in Examples 1 to 6 and Comparative Example 1 were coated on semiconductor substrates (silicon wafers) by means of a spinner, respectively. The coated silicon wafers were baked at 205° C. for 1 minute on a hot plate to form anti-reflective coatings (film thickness 100 nm). On each anti-reflective coating was coated a commercially available photoresist solution (trade name: APEX-E manufactured by Shipley Company, etc.) by means of a spinner. The coated wafers were heated at 90° C. for 1 minute on a hot plate. After exposure of the photoresists to light, post exposure bake was performed at 90° C. for 1.5 minute. After developing the photoresists, the film thickness of the anti-reflective coatings was measured and no change in the film thickness was observed. Therefore, it was confirmed that no intermixing occurred between the anti-reflective coatings obtained from the solutions of the anti-reflective coating forming compositions prepared in Examples 1 to 6 and Comparative Example 1 and the photoresist layers.

Test of Optical Parameter

The anti-reflective coating forming composition solutions prepared in Examples 1 to 6 and Comparative Example 1 were coated on semiconductor substrates (silicon wafers) by means of a spinner. The coated silicon wafers were baked at 205° C. for 1 minute on a hot plate to form anti-reflective coatings (film thickness 60 nm). On the anti-reflective coatings, refractive index (n) and attenuation coefficient (k) at a wavelength of 157 nm were measured with a spectroscopic ellipsometer (manufactured by J. A. Woolam Co., Inc., VUV-VASE VU-302). The measurement results are shown in Table 1. In addition, refractive index (n) and attenuation coefficient (k) at a wavelength of 193 nm were measured similarly to the above. The measurement results are shown in Table 2.

TABLE 1

|  | n | k |
| --- | --- | --- |
| Example 1 | 1.88 | 0.30 |
| Example 2 | 1.79 | 0.24 |
| Example 3 | 1.87 | 0.28 |
| Example 4 | 1.89 | 0.37 |
| Example 5 | 1.91 | 0.27 |
| Example 6 | 1.71 | 0.37 |
| Comparative Example 1 | 1.78 | 0.19 |

TABLE 2

|  | n | k |
| --- | --- | --- |
| Example 1 | 1.83 | 0.12 |
| Example 2 | 1.71 | 0.13 |
| Example 3 | 1.80 | 0.10 |
| Example 4 | 1.87 | 0.13 |
| Example 5 | 1.82 | 0.11 |
| Example 6 | 1.98 | 0.35 |

Proportion of Sulfur Atom

Table 3 shows the proportion of sulfur atom in the polymers used in Examples 1 to 6, and the proportion of sulfur atom in the solid content of the anti-reflective coating forming compositions of Examples 1 to 6. In Table 3, the proportion (mass %) of sulfur atom in polymers is shown in the column (A), and the proportion (mass %) of sulfur atom in solid content is shown in the column (B).

TABLE 3

|  | (A) | (B) |
| --- | --- | --- |
| Example 1 | 24 | 19 |
| Example 2 | 9 | 8 |
| Example 3 | 21 | 16 |
| Example 4 | 29 | 23 |
| Example 5 | 20 | 16 |
| Example 6 | 17 | 13 |

Measurement of Etching Rate

The anti-reflective coating forming composition solutions prepared in Examples 1 to 6 were coated on semiconductor substrates (silicon wafers) by means of a spinner, respectively. The coated silicon wafers were baked at 205° C. for 1 minute on a hot plate to form anti-reflective coatings (film thickness 100 nm). Then, etching rate (decreased amount of film thickness per unit time) on these anti-reflective coatings was measured with RIE system ES401 manufactured by Nippon Scientific Co., Ltd. under the condition in which $CF_4$ was used as dry etching gas. Then, a photoresist solution (trade name: PAR710 manufactured by Sumitomo Chemical Co., Ltd.) for process with ArF excimer laser beam was coated on a semiconductor substrate (silicon wafer) by means of a spinner. The coated silicon wafer was baked to form a photoresist. Then, etching rate was measured similarly to the above. The dry etching rate was compared between the anti-reflective coatings formed from the compositions of Examples 1 to 6 and photoresist PAR710. The results are shown in Table 4. In Table 4, etching rate means the etching rate of each anti-reflective coating in case where the dry etching rate of the photoresist PAR710 is regarded as 1.00.

TABLE 4

|  | Etching Rate |
| --- | --- |
| Example 1 | 2.30 |
| Example 2 | 2.18 |
| Example 3 | 2.13 |
| Example 4 | 2.28 |
| Example 5 | 2.28 |
| Example 6 | 2.00 |

The invention claimed is:
1. An anti-reflective coating forming composition comprising a solid content and a solvent
wherein a proportion of sulfur atom in the solid content is 5 to 25 mass %;

the solid content contains a polymer having sulfur atom in an amount of 8 to 30 mass %, a crosslinking compound and an acid compound;

and the polymer has a repeating structural unit selected from the group consisting of formula (7), (8) and (9)

(7)
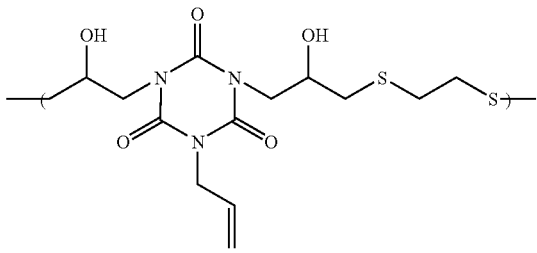

(8)
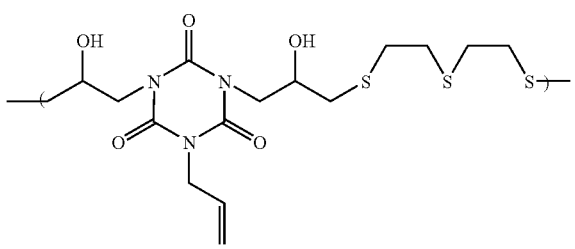

(9)
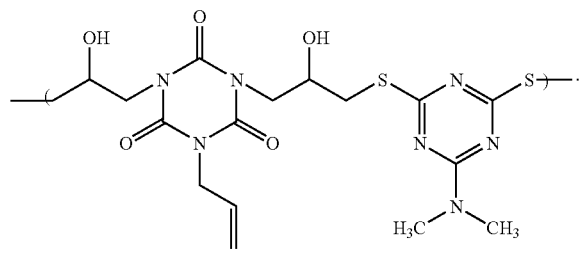

2. The anti-reflective coating forming composition according to claim 1, wherein the polymer is a polymer produced by reacting a compound having at least two thiol groups with a compound having two epoxy groups.

3. A method for forming photoresist pattern for use in manufacture of semiconductor device, comprising the steps of:

coating the anti-reflective coating forming composition according to claim 1 on a semiconductor substrate, and baking it to form an anti-reflective coating, forming a photoresist layer on the anti-reflective coating, exposing the semiconductor substrate covered with the anti-reflective coating and the photoresist layer to light, and developing the photoresist layer after the exposure to light.

4. The anti-reflective coating forming composition comprising a solid content and a solvent;

wherein a proportion of sulfur atom in the solid content is 5 to 25 mass %;

the solid content contains a polymer having sulfur atom in an amount of 8 to 30 mass %, a crosslinking compound and an acid compound;

and the polymer is a polymer produced from at least one compound selected from the group consisting of acrylic acid ester compounds having at least one sulfur atom, methacrylic acid ester compounds having at least one sulfur atom, and styrene compounds having at least one sulfur atom.

* * * * *